United States Patent [19]

Nonaka

[11] 4,150,392
[45] Apr. 17, 1979

[54] SEMICONDUCTOR INTEGRATED FLIP-FLOP CIRCUIT DEVICE INCLUDING MERGED BIPOLAR AND FIELD EFFECT TRANSISTORS

[75] Inventor: Terumoto Nonaka, Hamamatsu, Japan

[73] Assignee: Nippon Gakki Seizo Kabushiki Kaisha, Hamamatsu, Japan

[21] Appl. No.: 820,245

[22] Filed: Jul. 29, 1977

[30] Foreign Application Priority Data

Jul. 31, 1976 [JP] Japan .................................. 51-90861
Sep. 8, 1976 [JP] Japan ............................... 51-106760

[51] Int. Cl.² .......................................... H01L 27/02
[52] U.S. Cl. ......................................... 357/43; 357/23; 357/36; 307/279; 307/238; 307/291; 365/154; 365/155
[58] Field of Search ....................... 357/22, 23, 43, 36; 307/279, 238, 291; 365/154, 155

[56] References Cited

U.S. PATENT DOCUMENTS

| | | | |
|---|---|---|---|
| 3,530,443 | 9/1970 | Crafts et al. ............................ | 357/23 |
| 3,564,300 | 2/1971 | Henle ..................................... | 307/279 |
| 3,655,999 | 4/1972 | Wiedmann ............................ | 307/291 |
| 3,731,164 | 5/1973 | Cheney .................................. | 357/43 |
| 3,986,173 | 10/1976 | Baitinger et al. ....................... | 357/43 |
| 3,993,918 | 11/1976 | Sinclair .................................. | 307/291 |
| 4,032,961 | 6/1977 | Baliga et al. ........................... | 357/43 |
| 4,056,810 | 11/1977 | Hart et al. .............................. | 357/43 |

OTHER PUBLICATIONS

S. Wiedmann, "Monolithic Memory Cell with Junction FET Loads", IBM Tech. Discl. Bull., vol. 13, #2, Jul. 1970, pp. 477, 478.

Primary Examiner—Joseph E. Clawson, Jr.
Attorney, Agent, or Firm—Cushman, Darby & Cushman

[57] ABSTRACT

A semiconductor integrated circuit comprises a pair of load transistors and a pair of inverter transistors to constitute a flip-flop circuit. The load transistors are formed of p-channel field effect transistors serving as carrier injectors for the inverters formed of npn bipolar transistors. The p-type drain region of each load transistor is merged into the p-type base region of each inverter transistor. The absence of carrier storage effect in the field effect transistors improves the operation speed of the flip-flop remarkably and the high impedance gate electrode can be utilized as the clocking electrode to achieve clocking with voltage pulses without substantial power consumption. A plurality of such flip-flops are connected in cascode one after another to constitute a shift register.

8 Claims, 19 Drawing Figures

SEMICONDUCTOR INTEGRATED FLIP-FLOP CIRCUIT DEVICE INCLUDING MERGED BIPOLAR AND FIELD EFFECT TRANSISTORS

BACKGROUND OF THE INVENTION

1. Field of the Invention

The present invention relates to a semiconductor integrated circuit, and more particularly it pertains to a semiconductor integrated circuit including merged transistors constituting a flip-flop circuit.

2. Description of the Prior Art

Hereinbelow, description will be made in connection with the accompanying drawings.

FIGS. 1 and 2 show a conventional semiconductor memory cell proposed in IEEE Journal of Solid State Circuits, October 1973. A memory cell of FIG. 1 is formed with a pair of inverter transistors $Q_3$ and $Q_4$ for holding memory, a pair of load transistors $Q_1$ and $Q_2$, and a pair of current source transistors $Q_5$ and $Q_6$. The collectors of the inverter transistors $Q_3$ and $Q_4$ are connected to the bases of the inverter transistors $Q_4$ and $Q_3$, respectively. This memory cell is achieved by the structure as shown in FIG. 2. In FIG. 2, a semiconductor wafer 10 is comprised of an n type semiconductor substrate 11 of a low resistivity and an n type epitaxial layer 12 of a relatively high resistivity grown thereon. In this n type layer 12, p type semiconductor regions 13, 14, 15, 16 and 17 of a relatively low resistivity are formed by relying on the selective diffusion technique. Furthermore, in the p type regions 14 and 16 are formed n type semiconductor regions 18 and 19 of a further low resistivity. Metal electrodes 20, 21, 22, 23, 24, 25 and 26 are formed on the respective semiconductor regions 13, 14, 15, 16, 17, 18 and 19. Another electrode 27 is formed on the lower surface of the semiconductor substrate 11. Pairs of the electrodes 21 and 26, and 23 and 25 are electrically connected through metal layers. The electrode 27 is used as the X address electrode, and the electrode 22 as the Y address electrode. The electrodes 20 and 24 are used as the read/write electrodes $RW_0$ and $RW_1$, respectively.

Now, the correlation between FIGS. 1 and 2 will be described. The semiconductor regions 12, 14 and 15 constitute the base, the collector and the emitter of the pnp type bipolar transistor $Q_1$, respectively. The semiconductor regions 12, 16 and 15 constitute the base, the collector and the emitter of the pnp type bipolar transistor $Q_2$, respectively. It will be seen that the emitter and the base regions of the pnp type bipolar transistors $Q_1$ and $Q_2$ are common with each other, and connected to the electrodes Y and X. The semiconductor regions 12, 16 and 19 constitute the emitter, the base and the collector regions of the npn bipolar transistor $Q_3$, respectively, while the semiconductor regions 12, 14 and 18 constitute the emitter, the base and the collector regions of the npn transistor $Q_4$, respectively. Here, the $n^+$ type region 11 is considered as part of the n type region 11. The semiconductor regions 17, 12 and 16 constitute the emitter (or collector), the base and the collector (or emitter) regions of the pnp type transistor $Q_5$, respectively, while the semiconductor regions 13, 12 and 14 constitute the collector (or emitter), the base and the emitter (or collector) regions of the pnp type transistor $Q_6$, respectively. The p type collector region 14 of the pnp type transistor $Q_1$ is connected to the n type collector region 19 of the npn type transistor $Q_3$ through a metal lead, and similarly the p type collector region 16 of the pnp type transistor $Q_2$ is connected to the n type collector region 18 of the npn type transistor $Q_4$.

Such a conventional semiconductor memory cell is accompanied by the following drawbacks and inconveniences.

The collector loads for the inverter transistors $Q_3$ and $Q_4$ for holding the memory content are formed with bipolar transistors $Q_1$ and $Q_2$ of the lateral structure as shown in FIG. 2. Therefore, the switching speed of these transistors $Q_1$ and $Q_2$ cannot be made very high. Then, the maximum operation speed of this conventional memory cell is limited by the switching speed of the transistors $Q_1$ and $Q_2$.

Furthermore, the clocking for this memory cell should be achieved by applying power pulses to the Y address electrode Y. Thus, the power required for clocking is large.

In the above structure, the transistors $Q_1$ and $Q_2$ inject carriers into the base regions of the transistors $Q_4$ and $Q_3$. In the bipolar transistor of the lateral structure, it is very difficult to reduce the base width $W_B$ from the viewpoint of manufacture, and hence the carrier injection efficiency (equal to the common base current amplification factor) can not be made high. Namely, the leak component of carriers is large, and hence the power dissipation is large. Particularly, when the quantity of injected carriers becomes large, the potentials at the collectors 14 and 16 of the transistors $Q_1$ and $Q_2$ rise to cause the reverse injection from these collectors 14 and 16, and the pn-junction between the emitter 15 and the base 12 is forwardly and deeply biased. Thus, the effect of the base resistance becomes large, and the ratio of carriers escaping into the semiconductor substrate 11 increases. Therefore, the carrier injection efficiency $\alpha$ rapidly decreases as the injection current (the current injected from the Y address electrode Y) increases. There is the need of increasing the injection current to inject many carriers for reducing the charging and discharging time period for the parasitic capacitances at respective portions and for increasing the switching speed of the transistors $Q_1$ and $Q_2$. Here, power loss rapidly increases as the injection current is increased. Thus, there is difficulty in integrating the conventional memory cells with a high density.

FIGS. 3 and 4 show an example of the conventional semiconductor register cell. A register cell is formed with a master flip-flop MF and a slave flip-flop SF. Each of these flip-flops includes four transistors $Q_1$ to $Q_4$. Each of the inverter transistors $Q_3$ and $Q_4$ has two collectors, one of which is connected to the base of the other inverter transistor of the same flip-flop. The load transistors $Q_1$ and $Q_2$ also serve to inject carriers into the bases of the inverter transistors $Q_4$ and $Q_3$. Namely, the load transistor $Q_1$ injects carriers into the base of the inverter transistor $Q_4$ when the other inverter transistor $Q_3$ is turned off.

A first clock pulse signal $\phi_1$ is applied to the common emitter of the load transistors $Q_1$ and $Q_2$ of the master flip-flop MF, while a second clock pulse signal $\phi_2$ in opposite phase to the first clock pulse signal $\phi_1$ is applied to the common emitter of the load transistors $Q_1$ and $Q_2$ of the slave flip-flop SF. The second collectors of the inverter transistors $Q_3$ and $Q_4$ of the master flip-flop MF are connected to the first collectors of the inverter transistors $Q_3$ and $Q_4$ of the slave flip-flop SF through lines $L_1$ and $L_2$, respectively. The inputs to this register cell, e.g. the outputs of another register cell, are supplied to the bases of the inverter transistors $Q_4$ and $Q_3$ of the master flip-flop MF through lines $L_3$ and $L_4$, respectively. The outputs of this register cell, i.e. the signals at the second collectors of the inverter transistors $Q_3$ and $Q_4$ of the slave flip-flop SF, are supplied to the following register cell or other logic circuit portion through lines $L_5$ and $L_6$, respectively.

Since the operation of this register cell is well known, brief description thereof will be made hereinbelow. First, when the clock pulse $\phi_1$ arrives with the lines $L_3$ and $L_4$ being held at a high and a low potential, carriers are injected from the load transistor $Q_1$ to the base of the inverter transistor $Q_4$, thereby to turn the inverter transistor $Q_4$ on. Carriers which may be injected from the load transistor $Q_2$ are absorbed by the turned-on inverter transistor $Q_4$, thereby holding the inverter transistor $Q_3$ in its turned-off state. If a parasitic capacitance $C_1$ accompanied by the line $L_1$ has been charged up, the positive potential of the line $L_1$ is held as it was. On the other hand, a parasitic capacitance $C_2$ of the other line $L_2$ is discharged through the turned-on inverter transistor $Q_4$ to lower the potential of the line $L_2$.

Then, when the clock pulse $\phi_2$ arrives (at this moment the clock pulse $\phi_1$ is vanished), the inverter transistor $Q_4$ is turned on and the state of the inverter transistors $Q_3$ and $Q_4$ are stored in the parasitic capacitances $C_5$ and $C_6$ of the lines $L_5$ and $L_6$.

In this way, the master flip-flop MF and the slave flip-flop SF are alternately clocked by the clock pulses $\phi_1$ and $\phi_2$, and the information given to the input lines $L_3$ and $L_4$ of the register cell are sent out from the output lines $L_5$ and $L_6$ of the register at a predetermined timing.

As can be seen from FIG. 3, the master flip-flop MF and the slave flip-flop SF may have the same structure. A structure of the master or slave flip-flop is shown in FIG. 4.

In the figure, an n type semiconductor wafer 110 is formed with an n-type semiconductor substrate 111 of a low resistivity and an n type epitaxial layer 112 of a relatively high resistivity grown on the substrate 111. In the n type epitaxial layer 112, p type regions 113, 114 and 115 of a relatively low resistivity are formed by, for example, the selective diffusion technique. In the p type regions 113 and 115, n type regions 116, 117, 118 and 119 of a low resistivity are formed by, for example, the selective diffusion. Metal electrodes 120, 121, 122, 123, 124, 125 and 126 are formed on the regions 113, 114, 115, 116, 117, 118 and 119, respectively. Another electrode 127 is formed on the lower surface of the n type semiconductor substrate 111. Pairs of the electrodes 120 and 125, and 122 and 124 are connected by metal leads.

Correlation of the structure of FIG. 4 and one flip-flop in the register of FIG. 3 is as follows. Semiconductor regions 112, 113 and 114 constitute the base, the collector and the emitter of the load transistor $Q_2$, respectively, while the regions 112, 114 and 115 constitute the base, the emitter and the collector of the load transistor $Q_1$, respectively. The regions 112, 115 and 118 and 119 constitute the emitter, the base and the first and the second collectors of the inverter transistor $Q_4$, respectively, while the regions 112, 113 and 116 and 117 constitute the emitter, the base and the first and the second collectors of the inverter transistor $Q_3$, respectively. Here, the n type region 111 is considered as part of the n type region 112.

As can be seen from the above statement, the conventional register cell as described above has similar drawbacks and inconveniences as described above with respect to the memory cell.

Namely, since the load transistors $Q_1$ and $Q_2$, which inject carriers to the inverter transistors $Q_4$ and $Q_3$ as well as serve as the collector loads for the inverter transistors $Q_3$ and $Q_4$, are formed with bipolar transistors, they have an inherently limited switching speed due to the carrier storage effect therein.

Furthermore, since the load transistors $Q_1$ and $Q_2$ have lateral structures, it is difficult to reduce the base width $W_B$ thereof, and hence is difficult to increase the carrier injection efficiency $\alpha$ (equal to the common base current amplifiction factor). Namely, the leak component of the carriers is large and the power loss is large. In particular, when the amount of the injected carriers becomes large, the potential at the collectors 113 and 115 of the injector transistors $Q_2$ and $Q_1$ rises to cause the reverse injection therefrom. Furthermore, the pn-junction between the emitter 114 and the base 112 becomes forwardly deeply biased, and hence the effect of the base resistance becomes large. Thus, the rate of the carriers escaping into the semiconductor substrate 111 increases. Therefore, the carrier injection efficiency $\alpha$ rapidly falls down with an increase in the injection current $I_i$ (the current flowing into the common emitter of the injector transistors $Q_1$ and $Q_2$), as shown in FIG. 16.

Furthermore, the conventional register cell should be clocked by applying clock pulse $\phi_1$ and $\phi_2$ to the emitters of the injector transistors of the master and the slave flip-flops. Thus, a large power is required for clocking.

SUMMARY OF THE INVENTION

An object of the present invention is to provide a semiconductor integrated circuit device which improves such conventional technical problems as described above.

Another object of the present invention is to provide a semiconductor integrated circuit device having an improved operation speed.

A further object of the present invention is to provide a semiconductor integrated circuit device having a small power dissipation and a high integration density.

Another object of the present invention relates to a semiconductor integrated circuit device requiring a small power for clocking.

According to an aspect of the present invention, there is provided a semiconductor integrated circuit device having flip-flop, each flip-flop comprising a pair of inverter transistors for holding the inputted state and a pair of load transistors for serving as the collector load and as the carrier injectors for the inverter transistors, the load transistors being formed with field effect transistors and having channels connected to the bases of the inverter transistors.

The above and other objects, the features as well as the advantages of the present invention will become apparent in the following detailed description of the preferred embodiments when taken in conjunction with the accompanying drawings.

DETAILED DESCRIPTION OF THE PREFERRED EMBODIMENTS

Figure 1:
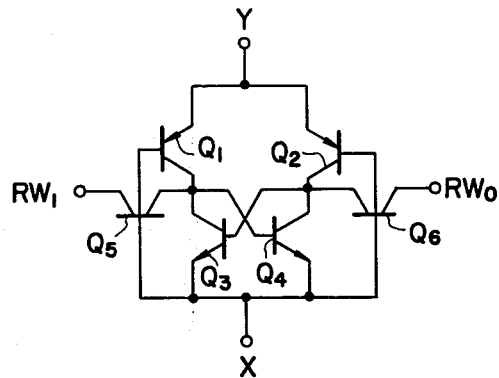
FIG. 1 is a circuit diagram of a conventional semiconductor memory cell.
Figure 2:
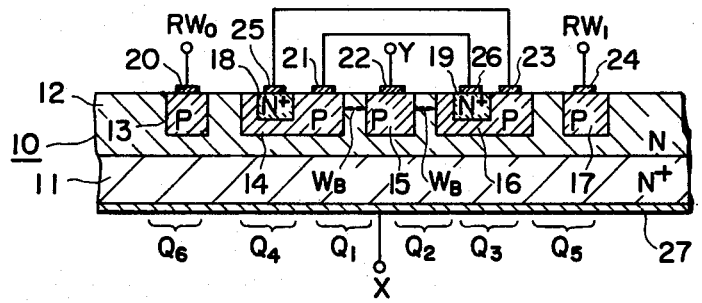
FIG. 2 is a partial cross-section of a conventional semiconductor integrated circuit device structure having the circuit connection of FIG. 1.
Figure 4:
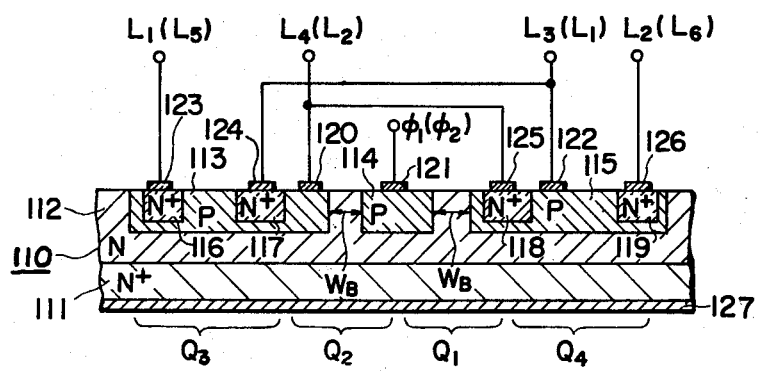
FIG. 4 is a partial cross-section of a conventional semiconductor integrated circuit device structure having the circuit connection of FIG. 3.
Figure 3:
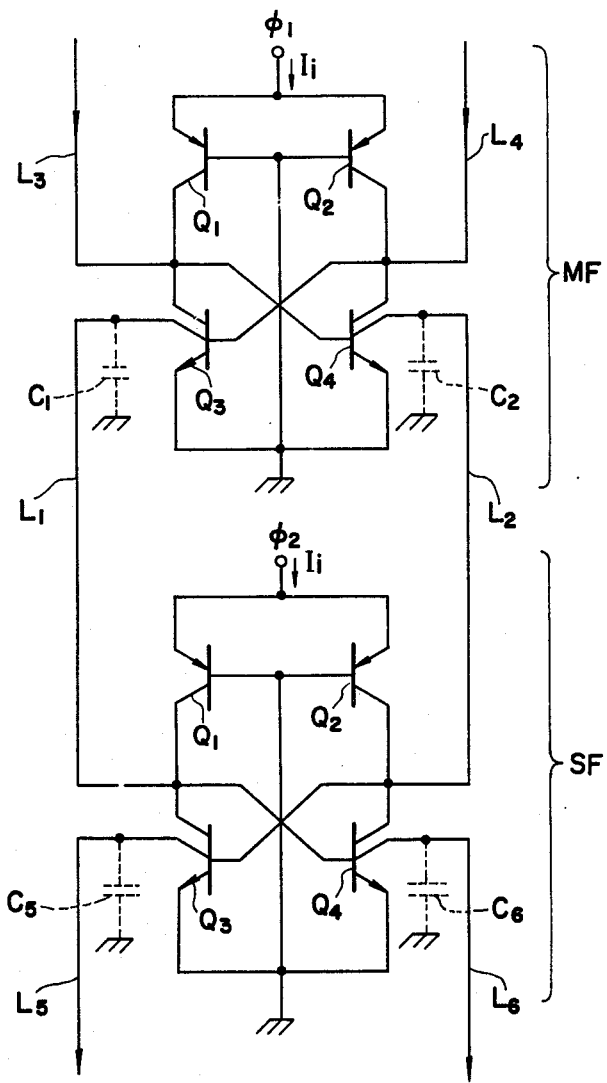
FIG. 3 is a circuit diagram of a conventional semiconductor register cell.
Figure 5:
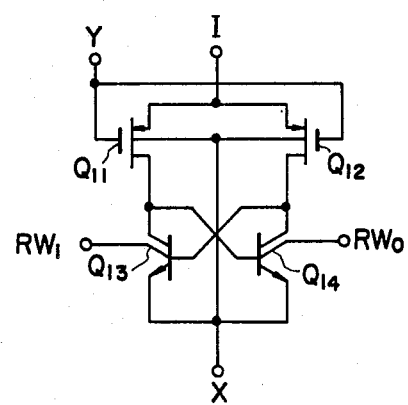
FIG. 5 is a circuit diagram of a semiconductor memory cell according to an embodiment of the present invention.

FIG. 5 shows a circuit diagram of a semiconductor memory cell, in which load transistors $Q_{11}$ and $Q_{12}$ are formed with insulated gate type field effect transistors and serve to inject carriers into the inverter transistors $Q_{13}$ and $Q_{14}$ as well as serve as the collector loads of inverter transistors $Q_{13}$ and $Q_{14}$.

Figure 6:
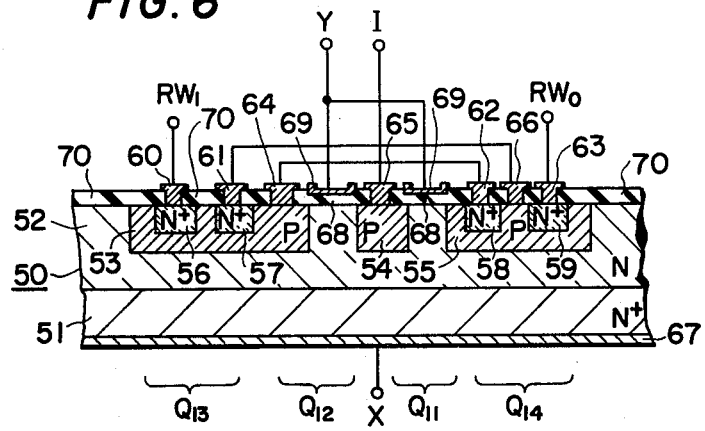
FIG. 6 is a partial cross-section of the semiconductor integrated circuit device structure embodying the circuit of FIG. 5.

FIG. 6 shows an example of a semiconductor integrated circuit device structure embodying the circuit of FIG. 5. In the figure, an n type semiconductor wafer 50 is formed with an n type semiconductor substrate 51 of a low resistivity, and with an n type epitaxial layer 52 of a relatively low resistivity grown thereon. In the n type epitaxial layer 52, there are formed p type diffused regions 53, 54 and 55 of a relatively high resistivity. In the p type regions 53 and 55, n type regions 56, 57, 58 and 59 of a low resistivity are formed. Metal electrodes 60, 61, 62 and 63 are formed on the n type regions 56, 57, 58 and 59. Further metal electrodes 64, 65, 66 and 67 are formed on the p type regions 53, 54 and 55 and on the n type semiconductor substrate 51. Insulated gate electrodes 69 are formed on portions of the n type region 52 between the p type region 54 and the p type regions 53 and 55 through gate insulating films 68. Numeral 70 denotes an oxide film. The electrode 65 is used as the injection electrode I, the electrodes 60 and 63 as the read/write electrodes $RW_1$ and $RW_0$, the electrode 68 as the Y address electrode Y and the electrode 67 as the X address electrode X.

The correlation between FIGS. 5 and 6 are as follows. The semiconductor regions 52, 53 and 56 and 57 constitute the emitter, the base and the collectors of the npn type multi-collector inverter transistor $Q_{13}$, respectively, while the regions 52, 55 and 58 and 59 constitute the emitter, the base and the collectors of the other npn type multi-collector inverter transistor $Q_{14}$, respectively. The p type regions 53 and 54 constitute the drain and the source of the p-channel insulated gate type field effect transistor $Q_{12}$ which serves as the collector load for the inverter transistor $Q_{14}$ and as the carrier injector for the inverter transistor $Q_{13}$, respectively. The p type regions 54 and 55 constitute the source and the drain of the other p-channel insulated gate type field effect transistor $Q_{11}$ which serves as the collector load for the inverter transistor $Q_{13}$ and as the carrier injector for the inverter transistor $Q_{14}$, respectively. The p-channels of these field effect transistors are induced in the surface portion of the n type region 52 below the gate electrodes 68 and 69.

The operation of the embodiment of FIGS. 5 and 6 is as follows.

a. Cell Selection

In the memory cell to be selected, the voltage on the line of the Y address electrode Y is raised, and the voltage on the line of the X address electrode X is lowered. In the semiconductor integrated circuit device, a plurality of such memory cells are generally arranged in a matrix pattern which will be referred to later.

b. Write Operation

The voltage on one of the read/write electrodes $RW_0$ and $RW_1$ of a selected memory cell is lowered in accordance with the information to be written in. For example, if the voltage of the read/write electrode $RW_1$ is lowered, carriers are drawn into the base 53 of the transistor $Q_{13}$. Then, the line voltage of the Y address electrode Y is lowered to such a degree that carriers are injected from the field effect transistor $Q_{12}$ to the base of the transistor $Q_{13}$ to hold the transistor $Q_{13}$ in its turned-on state. Since the write information is set in the memory cell by the above-stated operation, the line voltage of the read/write electrode $RW_1$ may be returned to the ordinary value thereafter.

c. Read Operation

When both the line voltages of the read/write electrodes $RW_0$ and $RW_1$ of a selected memory cell are raised, a current is allowed to flow through either one line in accordance with the memory content in the memory cell. Then, the voltage of the read/write electrode connected to this line is lowered. Thus, the memory content of the memory cell can be read out from the polarity of the voltage difference between the two electrodes $RW_0$ and $RW_1$.

Figure 7A:
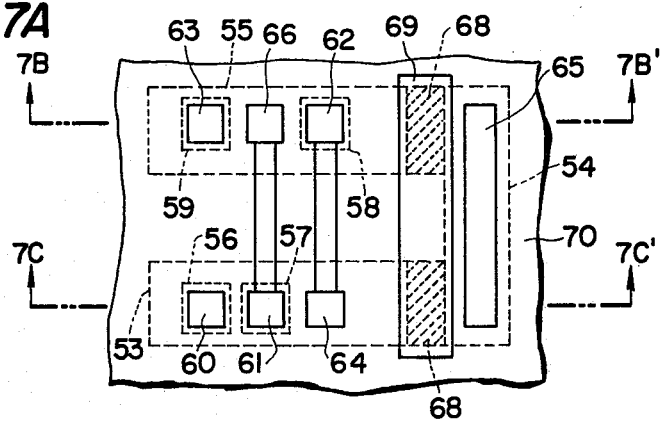
FIGS. 7A to 7C are a plan view and cross-sectional views of an alternative structure of the semiconductor integrated circuit device embodying the circuit of FIG. 5.
Figure 7B:
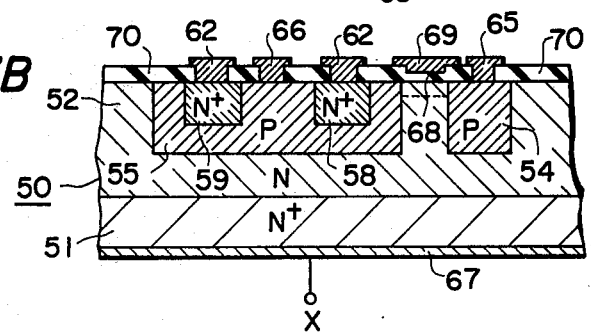
Figure 7C:
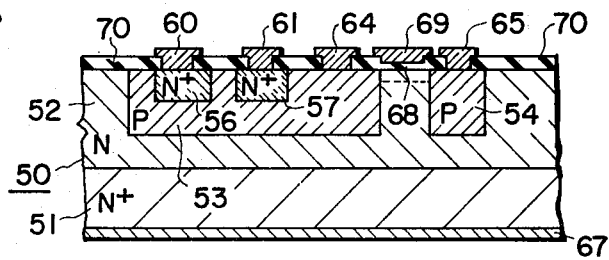

FIGS. 7A to 7C show an alteration of the above-mentioned embodiment. FIG. 7A shows a plan view and FIGS. 7B and 7C are cross-sections along the lines 7B–7B' and 7C–7C'. In this structure, transistors $Q_{13}$ and $Q_{14}$ are disposed in parallel to each other, and a common source 54 of field effect transistors $Q_{11}$ and $Q_{12}$ is disposed on one side of these transistors $Q_{13}$ and $Q_{14}$. Reference numerals similar to those of FIG. 6 denote similar parts.

Figure 8:
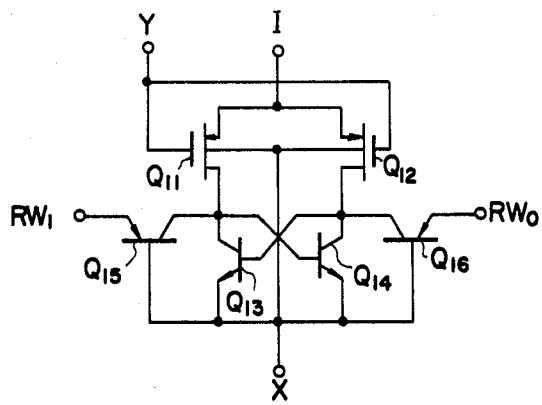
FIG. 8 is a circuit diagram of a semiconductor memory cell according to another embodiment of the present invention.
Figure 9:
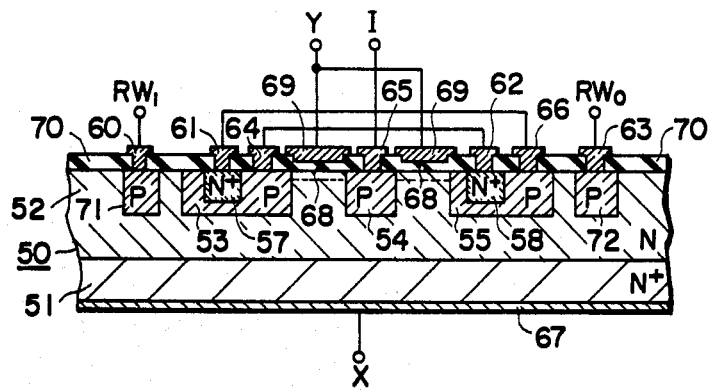
FIG. 9 is a partial cross-section of a semiconductor integrated circuit structure embodying the circuit of FIG. 8.

FIG. 8 shows another embodiment of a semiconductor memory cell in which read/write terminals $RW_0$ and $RW_1$ are derived through common base bipolar transistors $Q_{15}$ and $Q_{16}$. FIG. 9 shows a semiconductor integrated circuit device structure embodying the circuit of FIG. 8. In FIG. 9, p type regions 71 and 72 are formed in the n type epitaxial layer 52 to provide pnp type bipolar transistors $Q_{15}$ and $Q_{16}$ by the use of the n type region 52 and the p type regions 53 and 55. Naturally, the n type regions 56 and 59 for forming the multicollectors in the structure of FIG. 6 are dispensed with. Other portions are similar to those of the structure of FIG. 6, and accordingly similar reference numerals are used to denote similar parts.

The operation of this embodiment will be described briefly.

d. Cell Selection

The operation of cell selection is similar to that of the foregoing embodiment.

e. Read Operation

The read operation is also similar to the foregoing embodiment. For example, when the transistor $Q_{13}$ is turned on, the transistor $Q_{15}$ is also turned on to allow a current to flow through the line of the read/write electrode $RW_1$ so as to lower the line voltage of the electrode $RW_1$.

f. Write Operation

Operation similar to that of the above-stated embodiment holds true also. For example, the transistor $Q_{13}$ is turned on by supplying a current pulse of positive polarity to the line of the read/write electrode $RW_0$.

Figure 10:
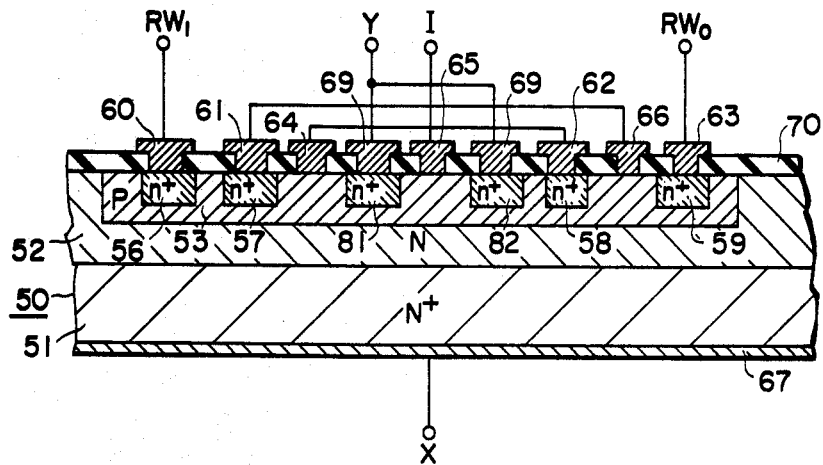
FIG. 10 is a partial cross-section of a semiconductor integrated circuit structure according to an embodiment of the present invention.

The load transistors of the foregoing embodiments are formed with insulated gate type field effect transistors. The load transistors may likewise be formed with junction type field effect transistors. An example of such a structure corresponding to the structure of FIG. 6 is shown in FIG. 10. Namely, n type gate regions 81 and 82 of a low resistivity are formed in a p type region 53. The p type regions 54 and 55 of FIG. 6 are integrated with the p type region 53. Gate electrodes 69 are formed on these n type regions 81 and 82. Furthermore, a source electrode 65 is formed on a portion of the p type region 53 sandwiched or surrounded by these n type regions 81 and 82 either directly or through a p type region of a low resistivity. Other portions are similar to those of the structure of FIG. 6, and therefore similar numerals are used to denote similar parts. Thus, the operations thereof are also similar to those of the structure of FIG. 6.

Figure 11:
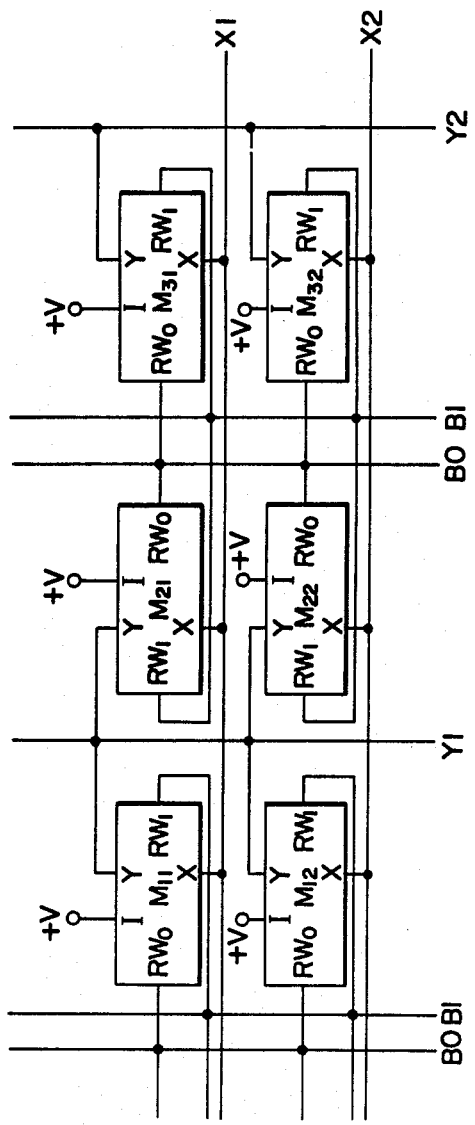
FIG. 11 is a circuit diagram of a memory matrix embodying the memory cells according to an embodiment of the present invention.

An example of a semiconductor memory cell array including a plurality of memory cells of the above-stated embodiments is partially shown in FIG. 11. In the figure, memory cells $M_{11}$ to $M_{32}$ having a structure as described in the above-stated embodiments are disposed in a matrix and connected with X address lines $X_1$ and $X_2$, Y address lines $Y_1$ and $Y_2$, and read/write lines $B_0$ and $B_1$. For example, when the memory cell $M_{21}$ is to be selected, the potential of the address line $X_1$ is lowered a little and the address line $Y_1$ is clocked as can be seen from the foregoing description. Further operations will be apparent from the foregoing description, and hence they are omitted here.

Figure 13:
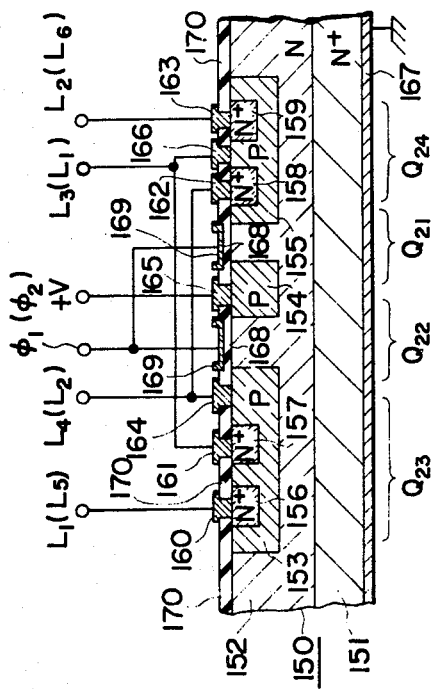
FIG. 13 is a partial cross-section of a semiconductor integrated circuit device structure embodying the circuit of FIG. 12.
Figure 12:
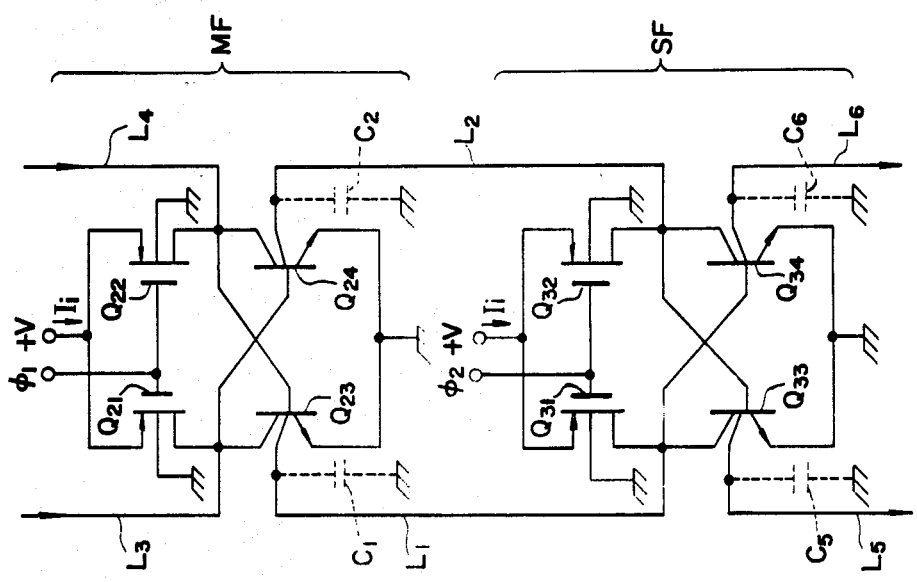
FIG. 12 is a circuit diagram of a semiconductor register cell according to an embodiment of the present invention.

FIG. 12 shows an embodiment of a semiconductor register cell formed in an integrated circuit. FIG. 13 shows an example of the structure embodying one flip-flop circuit of FIG. 12.

In this embodiment, load transistors $Q_{21}$ and $Q_{22}$ of the master flip-flop MF and load transistors $Q_{31}$ and $Q_{32}$ of the slave flip-flop SF are formed with field effect transistors. The field effect transistors may be either one of insulated gate type and of junction type. In these figures, insulated gate type field effect transistors are shown. A first clock pulse signal $\phi_1$ is applied to the common gate of the load transistors $Q_{21}$ and $Q_{22}$ of the master flip-flop MF, and a second clock pulse signal $\phi_2$ is applied to the common gate of the load transistors $Q_{31}$ and $Q_{32}$ of the slave flip-flop SF. A predetermined positive voltage $+V$ is applied to the source electrodes of these load transistors $Q_{21}$, $Q_{22}$, $Q_{31}$ and $Q_{32}$. As is apparent from the figure, the master flip-flop and the slave flip-flop have the identical structure.

A flip-flop structure of FIG. 12 is shown in FIG. 13. In FIG. 13, a semiconductor wafer 150 is formed with an n type semiconductor substrate 151 of a low resistivity and an n type epitaxial layer 152 of a relatively low resistivity. In this n type layer 152, p type regions 153, 154 and 155 of a relatively high resistivity are formed by, for example, the diffusion technique. In the p type regions 153 and 155, n type regions 156, 157, 158 and 159 of a low resistivity are formed. Metal electrodes 160, 161, 162 and 163 are formed on these n type regions 156, 157, 158 and 159. Other metal electrodes 164, 165, 166 and 167 are formed on the p type regions 153, 154 and 155 and also on the n type semiconductor substrate 151. Gate electrodes 169 are formed on such portions of the n type region 152 that are sandwiched between the p type region 154 and the p type regions 153 and 155 through gate insulating films 168. Numeral 170 denotes a passivating oxide film.

The p type semiconductor regions 154 and 155 constitute a source and a drain region of the p-channel insulated gate field effect transistor $Q_{21}$, respectively. The p-channel of this field effect transistor $Q_{21}$ is induced in the surface portion of the n type region 152 under the gate electrode 169. Similarly, the p type regions 153 and 154 constitute a drain and a source region of the p-channel insulated gate field effect transistor $Q_{22}$, respectively. The p-channel is induced under the gate electrode 169. These p-channel field effect transistors $Q_{21}$ and $Q_{22}$ serve as the injectors for the driver transistors $Q_{23}$ and $Q_{24}$, respectively. The semiconductor regions 152 (including 151), 153 and 156 and 157 constitute an emitter, a base and two collectors of the npn type bipolar multi-collector transistor $Q_{23}$, while the semiconductor regions 152 (including 151), 155 and 158 and 159 constitute an emitter, a base and two collectors of the npn type bipolar multi-collector transistor $Q_{24}$.

Figure 16:
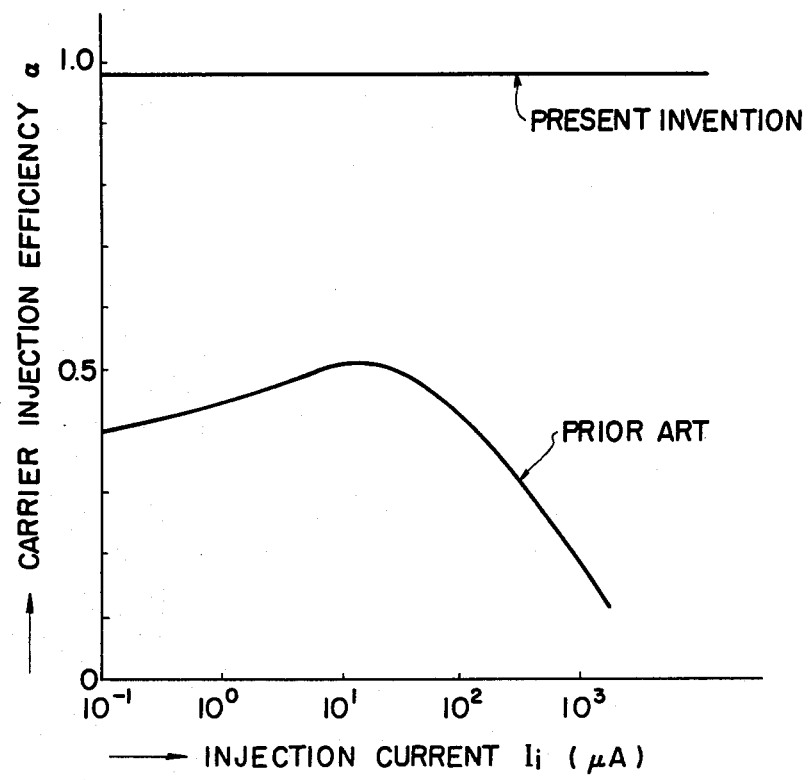
FIG. 16 is a graph of the carrier injection efficiency vs. injection current curves comparing the present invention with the prior art.

As described above, the load transistors of the master and the slave flip-flops MF and SF are formed with field effect transistors which inherently have no carrier storage effect. Furthermore, since these injector transistors inject carriers into the base regions of the inverter transistors through channels connected or continuous to the base regions, the carrier injection efficiency $\alpha$ is extremely high, and does not fall by the increase of the injection current $I_i$ as can be seen in FIG. 16. Therefore, the register cell of the above-stated embodiment enables a high speed operation and also a reduction in the power dissipation. Furthermore, the power required for clocking can be largely reduced since clocking is done by applying clock pulses $\phi_1$ and $\phi_2$ to the high impedance gates of the load transistors.

Figure 14A:
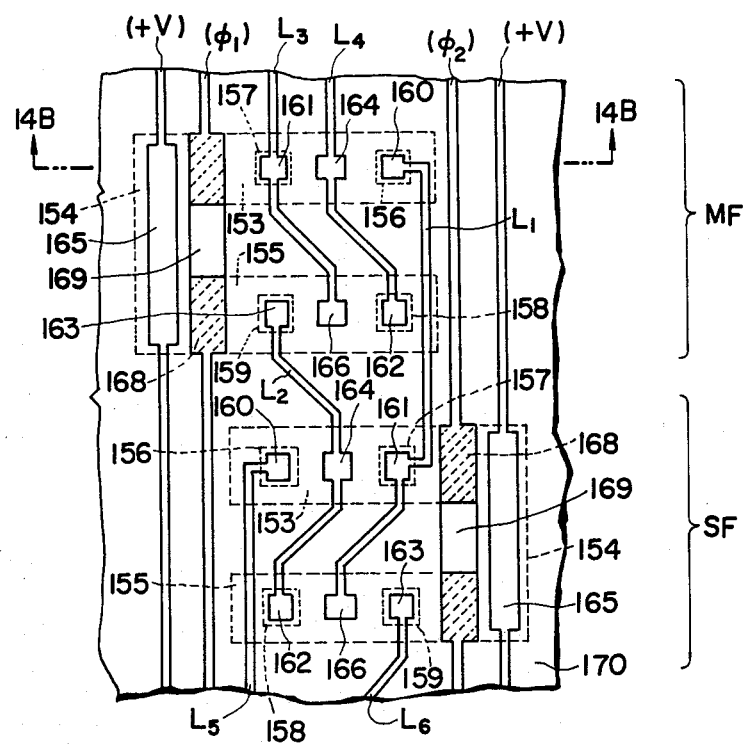
FIGS. 14A and 14B are a plan view and a partial cross-section of an alternative structure of the semiconductor integrated circuit device embodying the circuit of FIG. 12.
Figure 14B:
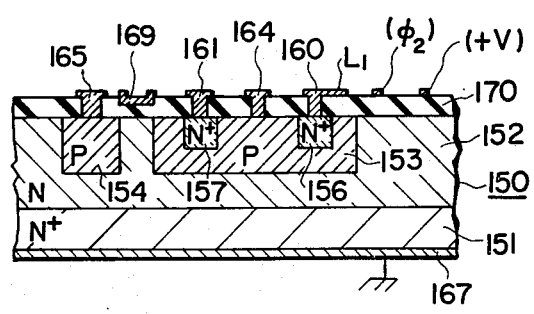

An alternative structure of the register cell embodying the circuit of FIG. 12 is shown in FIGS. 14A and 14B in which FIG. 14A is a plan view and FIG. 14B is a cross-section along the line 14B–14B' in this structure, inverter transistors $Q_{23}$ and $Q_{24}$ ($Q_{33}$ and $Q_{34}$) are disposed in parallel to each other and the source regions 54 for the load transistors $Q_{21}$ and $Q_{22}$ are located on one side of the inverter transistors $Q_{23}$ and $Q_{24}$ perpendicularly to the p type regions 53 and 55 as seen in FIG. 14A. This structure is similar to that of FIG. 13 in other respects. Similar numerals are used to denote similar parts to those of FIG. 13, and further description is omitted here.

Although the load transistors are formed with insulated gate type field effect transistors in the above embodiments, it will be apparent that they can be formed with junction type field effect transistors.

Figure 15:
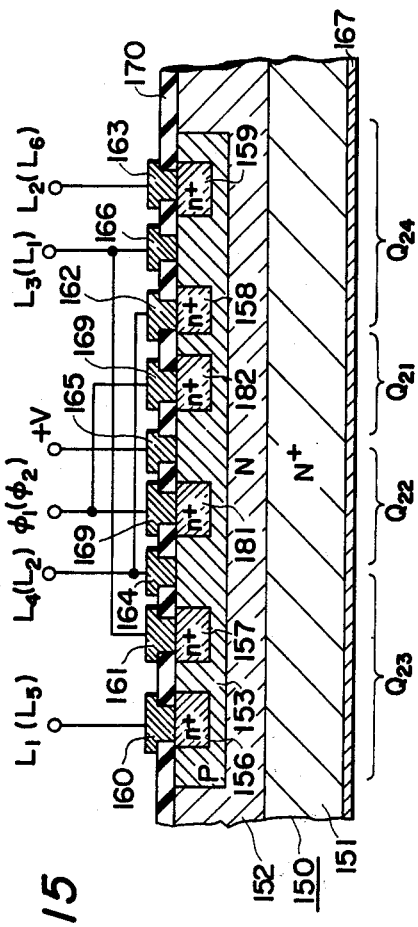
FIG. 15 is a partial cross-section of a semiconductor integrated circuit device structure according to an embodiment of the present invention.

FIG. 15 shows an alternative embodiment of a register cell, in which load transistors are formed with junction type field effect transistors. In FIG. 15, only the master flip-flop is shown since the slave flip-flop may have the identical structure.

In this embodiment, n type semiconductor regions 181 and 182 of a low resistivity for constituting the gate regions of the load transistors $Q_{21}$ and $Q_{22}$ are formed in a p type region 153 and gate electrodes 169 are formed on these n type regions 181 and 182. A source electrode 165 is formed on a portion of the p type region 153 sandwiched between the n type regions 181 and 182, directly or through a p type region of a low resistivity. As can be seen from the figure, this embodiment is similar to that of FIG. 13, excepting the point that the load transistors $Q_{21}$ and $Q_{22}$ are formed with junction type field effect transistors. Therefore, operation of this circuit is similar to that of the circuit of FIG. 13. Similar reference numerals are used to denote similar parts to those of FIG. 13.

As has been described hereinabove, according to the embodiments of the present invention, the load transistors of a flip-flop circuit serving also as the carrier injectors for the inverter transistors are formed with field effect transistors which inherently have no carrier storage effect. Thus, the switching speed of a flip-flop can be remarkably improved. Furthermore, since the load transistor injects carriers into the base region of the inverter transistor through a channel continuously connected to the base region, the carrier injection efficiency is very high, and does not fall down with an increase in the injection current. Thus, a high speed operation is possible by injecting sufficiently many carriers without increasing the ratio of leak carriers to the total of the injected carriers. Thus, a high density integration becomes possible. Furthermore, clocking can be achieved by applying voltage pulses to the gate of the load transistor, and thereby the power required for clocking can be remarkably reduced.

As such, there is provided a semiconductor integrated circuit provided with excellent features which can not be achieved by the conventional techniques. It will be apparent that the present invention is not limited to the above embodiments, and that many alterations and/or modifications are possible without departing from the spirit of the present invention. For example, the conductivity types of the respective semiconductor regions can, naturally, be reversed.

What is claimed is:

1. A semiconductor integrated circuit device including at least one register cell formed in a monolithic semiconductor wafer which comprises a semiconductor substrate of a first conductivity type and a semiconductor layer of said first conductivity type disposed on said semiconductor substrate, the register cell including a master flip-flop circuit clocked by a first clock signal, and a slave flip-flop circuit inputted with the outputs of said master flip-flop circuit and clocked by a second clock signal of opposite phase to said first clock signal, each of said master and slave flip-flop circuits comprising:

a first and a second bipolar transistor each having a base, a first and a second collector and an emitter; and a first and a second field effect transistor each having a drain, a gate and a source, the sources of both said first and second field effect transistors being merged in a first semiconductor region having a second conductivity type opposite to said first conductivity type and disposed in said semiconductor layer, the drain of said first field effect transistor and the base of said first bipolar transistor both being merged in a second semiconductor region of said second conductivity type disposed in said semiconductor layer, the drain of said second field effect transistor and the base of said second bipolar transistor both being merged in a third semiconductor region of said second conductivity type disposed in said semiconductor layer, the emitters of both said first and second bipolar transistors being merged in said semiconductor substrate, the first and second collectors of said first bipolar transistor being semiconductor regions of said first conductivity type disposed in said second semiconductor region, respectively, the first and second collectors of said second bipolar transistor being semiconductor regions of said first conductivity type disposed in said third semiconductor region, respectively, all of said first, second and third semiconductor regions being located adjacent to each other with no isolation layer intervening therebetween, the first collectors of said first and second bipolar transistors being connected to the drains of said second and first field effect transistors, respectively, the first clock signal being applied to both the gates of said first and second field effect transistors of said master flip-flop circuit, the second clock signal being applied to both the gates of said first and second field effect transistors of said slave flip-flop circuit, the second collectors of said first and second bipolar transistors of said master flip-flop circuit being connected to the first collectors of said first and second bipolar transistors of said slave flip-flop circuit, respectively.

2. A semiconductor integrated circuit device according to claim 1, in which: said first field effect transistor is an insulated gate type field effect transistor having a current channel formed in that portion of said semiconductor layer between said first and second semiconductor regions, and said second field effect transistor is an insulated gate type field effect transistor having a current channel formed in that portion of said semiconductor layer between said first and third semiconductor regions.

3. A semiconductor integrated circuit device according to claim 1, in which: all of said first, second and third semiconductor regions are merged in a common semiconductor region of said second conductivity type disposed in said semiconductor layer, and in which: said first and second field effect transistors are junction type field effect transistors, and each of the gates of said first and second field effect transistors is a semiconductor region of said first conductivity type disposed in said common semiconductor region adjacent to said first semiconductor region.

4. A semiconductor integrated circuit device including at least one flip-flop circuit formed in a monolithic semiconductor wafer, said monolithic wafer comprising a semiconductor substrate of a first conductivity type and a semiconductor layer of said first conductivity type disposed on said semiconductor substrate, said flip-flop circuit comprising:
a first and a second bipolar transistor having a base, a collector and an emitter, respectively; and
a first and a second field effect transistor having a drain, a gate and a source, respectively,
the sources of both said first and second field effect transistors being merged in a first semiconductor region having a second conductivity type opposite to said first conductivity type and disposed in said semiconductor layer,
the drain of said first field effect transistor and the base of said first bipolar transistor both being merged in a second semiconductor region of said second conductivity type disposed in said semiconductor layer,
the drain of said second field effect transistor and the base of said second bipolar transistor both being merged in a third semiconductor region of said second conductivity type disposed in said semiconductor layer,
the emitters of both said first and second bipolar transistors being merged in said semiconductor substrate,
the collector of said first bipolar transistor being a semiconductor region of said first conductivity type disposed in said second semiconductor region,
the collector of said second bipolar transistor being a semiconductor region of said first conductivity type disposed in said third semiconductor region,
all of said first, second and third semiconductor regions being located adjacent to each other with no isolation layer intervening therebetween,
the gates of both said first and second field effect transistors being connected together,
the collectors of said first and second bipolar transistors being connected to the drains of said second and first field effect transistors, respectively.

5. A semiconductor integrated circuit device according to claim 4, in which:
said first field effect transistor is an insulated gate type field effect transistor having a current channel formed in that portion of said semiconductor layer between said first and second semiconductor regions, and said second field effect transistor is an insulated gate type field effect transistor having a current channel formed in that portion of said semiconductor layer between said first and third semiconductor regions.

6. A semiconductor integrated circuit device according to claim 4, in which:
all of said first, second and third semiconductor regions are merged in a common semiconductor region of said second conductivity type disposed in said semiconductor layer, and in which: said first and second field effect transistors are junction type field effect transistors, and each of the gates of said first and second field effect transistors is a semiconductor region of said first conductivity type disposed in said common semiconductor region adjacent to said first semiconductor region.

7. A semiconductor integrated circuit device according to claim 4, in which:
said first bipolar transistor has another collector which is a semiconductor region of said first conductivity type disposed in said second semiconductor region, and said second bipolar transistor has another collector which is a semiconductor region of said first conductivity type disposed in said third semiconductor region.

8. A semiconductor integrated circuit device according to claim 5, further comprising:
a third and a fourth bipolar transistor each having a base, a collector and an emitter,
the collector of said third bipolar transistor being merged in said second semiconductor region,
the emitter of said third bipolar transistor being a fourth semiconductor region of said second conductivity type disposed in said semiconductor layer adjacent to said second semiconductor region,
the base of said third bipolar transistor being a portion of said semiconductor layer between said second and fourth semiconductor regions,
the collector of said fourth bipolar transistor being merged in said third semiconductor region,
the emitter of said fourth bipolar transistor being a fifth semiconductor region of said second conductivity type disposed in said semiconductor layer adjacent to said third semiconductor region,
the base of said fourth bipolar transistor being a portion of said semiconductor layer between said third and fifth semiconductor regions.

* * * * *